(12) United States Patent
Nagao

(10) Patent No.: US 7,566,594 B2
(45) Date of Patent: Jul. 28, 2009

(54) FABRICATING METHOD OF SEMICONDUCTOR DEVICE

(75) Inventor: Takeshi Nagao, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 124 days.

(21) Appl. No.: 11/812,717

(22) Filed: Jun. 21, 2007

(65) Prior Publication Data

US 2008/0057722 A1   Mar. 6, 2008

(30) Foreign Application Priority Data

Aug. 31, 2006   (JP) .............................. 2006-236685

(51) Int. Cl.
   *H01L 21/82* (2006.01)
(52) U.S. Cl. ...................... 438/132; 438/130; 438/601
(58) Field of Classification Search ................ 438/130, 438/131, 132, 598, 600, 601
   See application file for complete search history.

(56) References Cited

U.S. PATENT DOCUMENTS

| | | | |
|---|---|---|---|
| 5,096,850 A | 3/1992 | Lippitt, III | |
| 6,168,977 B1 * | 1/2001 | Konishi | 438/132 |
| 6,448,113 B2 * | 9/2002 | Lee et al. | 438/132 |
| 6,927,100 B2 * | 8/2005 | Ema | 438/132 |

FOREIGN PATENT DOCUMENTS

| | | |
|---|---|---|
| JP | 6-510164 | 11/1994 |
| JP | 10-074838 | 3/1998 |
| JP | 10-340956 | 12/1998 |
| JP | 11-067054 | 3/1999 |
| JP | 2003-037168 | 2/2003 |
| WO | WO 92/19009 | 10/1992 |

* cited by examiner

*Primary Examiner*—Kevin M Picardat
(74) *Attorney, Agent, or Firm*—Rabin & Berdo, PC

(57) ABSTRACT

A fuse region and a wiring region are defined on a base to form a fuse in the fuse region of the base. A first insulation film is formed on the base and the fuse. After a first contact opening is formed in the first insulation film in the wiring region, a first plug is formed by filling a conductive material in the first contact opening. A second insulation film is formed on the first insulation film. A second contact opening, in which the first plug is exposed, and a stopper opening, in which the first insulation film of the fuse region is exposed, are formed in the second insulation film. A second plug is formed by filling the second contact opening with a conductive material and a stopper film is formed by filling the stopper opening with conductive material.

12 Claims, 6 Drawing Sheets

FABRICATING METHOD OF SEMICONDUCTOR DEVICE

CROSS-REFERENCE TO RELATED APPLICATION

This application claims priority under 35USC 119 from Japanese Patent Application No. 2006-236685, the disclosure of which is incorporated by reference herein.

BACKGROUND OF THE INVENTION

1. Field of the Invention

The present invention relates to a fabricating method of semiconductor device and more particularly to a fabricating method of a semiconductor device having a fuse.

2. Description of Related Art

For repairing a fault generated in a semiconductor device, there is an art of avoiding the fault by forming a fuse in the semiconductor device preliminarily and cutting the fuse by laser beam. Insulation film having a specific thickness needs to be formed on the fuse in order to prevent malfunction of the fuse. The reason is that if insulation film on a fuse is thicker than insulation film on other fuse, the fuse cannot be cut by laser irradiation having the same intensity.

Conventionally, there has been proposed a method of forming the insulation film having a specific thickness (see Japanese Patent Application Laid-Open (JP-A) No. 11-67054). This conventional method will be described briefly.

First, a fuse region is defined on one main surface of a semiconductor substrate which serves as a base and a fuse is formed in the fuse region on the base.

Next, an insulation film of silicon oxide film is formed on the main surface in which the fuse of the base is formed.

After conductive film of polycrystalline silicon film is formed on the insulation film, a first conductive film pattern is formed on the insulation film by patterning the conductive film. The first conductive film pattern is comprised of a stopper film formed to cover the insulation film in the fuse region and LSI wirings formed in wiring region which is an area with no fuse formed.

Next, a first interlayer insulation film covering the first conductive film pattern is formed on the insulation film and further a second conductive film pattern is formed on the first interlayer insulation film. The second conductive film pattern is constituted of the LSI wirings formed in the wiring region. Next, the second interlayer insulation film for covering the second conductive film pattern is formed on the first interlayer insulation film and further, a third conductive film pattern is formed on the second interlayer insulation film. The second conductive film pattern and the third conductive film pattern are formed of aluminum alloy.

After that, a protective film for covering the third conductive film pattern is formed on the second interlayer insulation film. The protective film is formed of, for example, silicon nitride by CVD method.

After a resist layer is formed on the silicon nitride film by coating with a photo resist, resist pattern having an opening is formed in the resist layer in the fuse region by executing exposure and development to the resist layer.

Next, by dry etching with the resist pattern as a mask, the protective film in the fuse region, the second interlayer insulation film and the first interlayer insulation film are removed in order to form a fuse window. The stopper film is exposed on the bottom of the fuse window.

Next, the stopper film in the fuse region is removed by dry etching. By setting etching selectivity larger than 1 at this time, the stopper film in the fuse region may be removed securely and the insulation film in the fuse region may be left in a specific film thickness. If the stopper film is formed in a size larger than that of the fuse region, a portion of the stopper film is left in a frame-like form.

Currently, a method of forming the first conductive film pattern of the stopper film and the LSI wiring upon fabricating of a semiconductor device having a fuse has been proposed.

However, if the first conductive film pattern is formed of aluminum alloy like the second and third conductive film patterns, the stopper film is formed of aluminum alloy at the same time as when the LSI wiring is formed. Thus, when the stopper film is removed by dry etching, the portion of the stopper film left in a frame-like form within the fuse window is made of aluminum so that the aluminum is exposed within the fuse window. Aluminum corrodes easily and if aluminum corrodes, aluminum hydroxide is generated. There is a problem that aluminum hydroxide generated by this corrosion may make a circuit between cut fuse portions when electrode wiring is etched in a subsequent process, for example, after the fuse is cut out.

As a result of accumulated research by the inventor of this application, a method of forming the stopper film together with a contact plug at the same time as when forming the contact plug for electrically connecting the base with the LSI wiring has been found. According to this method, the first conductive film pattern does not include the stopper film. That is, the stopper film is formed in a layer different from the first conductive film pattern. Therefore, it has been found that even if the first conductive film pattern, that is, the LSI wiring is formed of aluminum alloy, aluminum which corrodes easily, may be blocked from being exposed on a side wall of the fuse window.

SUMMARY OF THE INVENTION

The present invention has been achieved in view of the above-described problems and an object of the invention is to provide a fabricating method of semiconductor device for preventing conduction between cut fuse sections by not exposing aluminum which corrodes easily on a side wall of a fuse window.

To achieve the above-described object, the fabricating method of the semiconductor device of the invention has the following processes.

First, a fuse region and a wiring region are defined on a base to form a fuse in the fuse region of the base and then, a first insulation film is formed on the base and the fuse. After a first contact opening is formed at a portion of the first insulation film in the wiring region, a first plug is formed by filling the first contact opening with a conductive material. Next, a second insulation film is formed on the first plug and the first insulation film and then, a second contact opening in which the first plug is exposed and a stopper opening, in which the first insulation film of the fuse region is exposed, are formed in the second insulation film. Next, a second plug is formed by filling the second contact opening with a conductive material and a stopper film is formed by filling the stopper opening with conductive material. Next, after the wiring pattern is formed on the second insulation film in the wiring region, an interlayer insulation film is formed on the stopper film, the wiring pattern and the second insulation film. Next, the stopper film is exposed by removing the interlayer insulation film in the fuse region by etching. Next, the stopper film is removed by etching.

According to the fabricating method of the semiconductor device of the invention, the stopper film is formed of conductive material at the same time when the second plug constituting the contact plug is formed. Accordingly, the thickness of the insulation film on the fuse may be reduced compared with a conventional art and even if aluminum alloy is used for wiring pattern, no aluminum is exposed on the side wall of the fuse window. Therefore, limitation of humidity resistance in a subsequent process may be relaxed.

BRIEF DESCRIPTION OF THE DRAWINGS

Preferred exemplary embodiments of the present invention will be described in detail based on the following figures, wherein.

DETAILED DESCRIPTION OF THE INVENTION

Although the embodiments of the present invention will be described with reference to the accompanying drawings, the shape, the size and the arrangement of each component are indicated only schematically to provide an explanation of the invention. Further, although preferred configuration examples of the invention will be described below, the composition (material) and numerical condition of each component are only preferred examples. Therefore, the invention is not restricted to the embodiments below.

(Semiconductor Device having a Fuse)

Figure 1A:
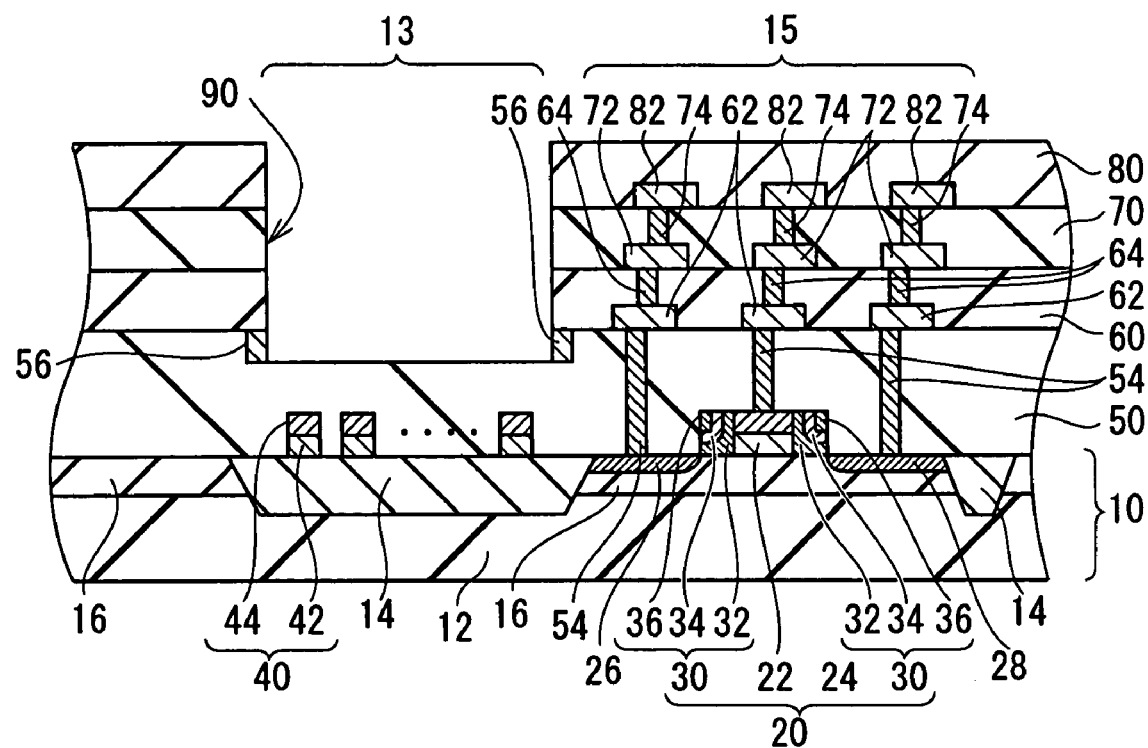
FIG. 1A is a schematic diagram for explaining a semiconductor device having a fuse.
Figure 1B:
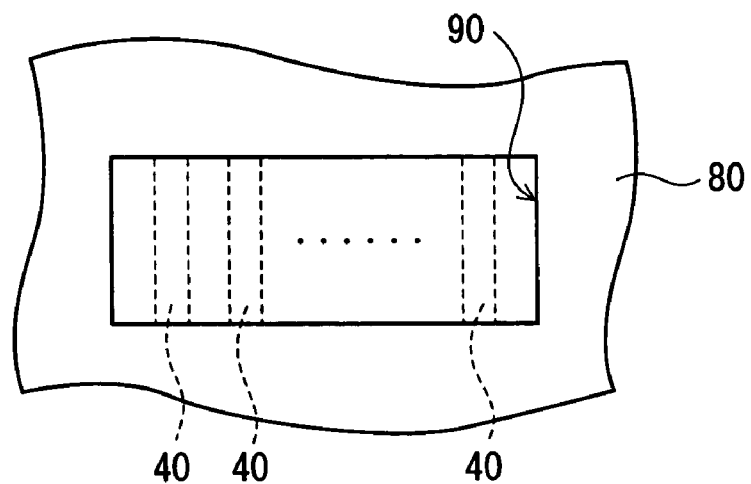
FIG. 1B is a schematic diagram for explaining a semiconductor device having a fuse.

The semiconductor device having a fuse will be described with reference to FIGS. 1A and 1B. FIGS. 1A and 1B are schematic diagrams for explaining the semiconductor device having a fuse. FIG. 1A is a diagram showing a sectional face of a major portion of the semiconductor device. FIG. 1B is an enlarged plan view of a portion in which the fuse is formed.

The semiconductor is constructed as a read only memory (ROM) 20 here. An example of the semiconductor memory having plural memory cells will be described. The ROM 20 is constructed to include a MOS type transistor (MOSFET) having a source 26, a drain 28 and a gate electrode 22 and charge accumulating portions 30 provided on both side walls of the gate electrode 22 of the MOSFET. A base 10 includes an element isolating oxide film 14 and an n-well 16 in its p-type silicon substrate 12.

The charge accumulating portion 30 possessed by the ROM 20 is constructed by laminating a bottom silicon oxide film 32, a silicon nitride film 34 and a top silicon oxide film 36, in this order. This silicon nitride film 34 functions as a charge accumulating film.

In this configuration, a fuse 40 is formed on the element isolating oxide film 14 and the ROM 20 is formed on the n-well 16. In the meantime, FIG. 1A shows one ROM 20 while illustration of other ROMs is omitted.

This semiconductor memory is provided with the fuse 40 which separates a defective memory cell to replace it with a redundancy memory cell. According to this configuration example, the fuse 40 includes a gate electrode wiring 42 connected electrically to the gate electrode 22 on the MOSFET and a silicon nitride film 44 formed on the gate electrode wiring 42. A silicon nitride film 24 is formed on the gate electrode 22 like the fuse 40. The number of the fuses 40 and connection relation between the gate electrode 22 and the gate electrode wiring 42 may be set arbitrarily corresponding to design of the semiconductor memory.

A first interlayer insulation film 50, a second interlayer insulation film 60 and a third interlayer insulation film 70 are formed such that they are laminated in this order on the base 10 in which the fuse 40 and the ROM 20 are formed. A first wiring pattern 62 is formed on the first interlayer insulation film 50, a second wiring pattern 72 is formed on the second interlayer insulation film 60, and a third wiring pattern 82 is formed on the third interlayer insulation film 70. Conductive plugs 54, 64 and 74 are formed between the base 10 or the gate electrode 22 and the first wiring pattern 62, between the first wiring pattern 62 and the second wiring pattern 72, and between the second wiring pattern 72 and the third wiring pattern 82, respectively, to electrically connect each of the relations.

Further, protective film 80 is formed on the third interlayer insulation film.

A fuse window 90 is formed in an area in which the fuse 40 is formed, that is, the fuse region 13. The fuse window 90 is formed by removing a part of each of the second interlayer insulation film 60, third interlayer insulation film 70 and protective film 80 within the fuse region 13. A top portion of the first interlayer insulation film 50 is removed so that the position of the top surface of the first interlayer insulation film 50 within the fuse region 13 is lower than the position of the top surface of the first interlayer insulation film 50 in the wiring region 15. A tungsten frame 56 is formed around the fuse window 90 in the first interlayer insulation film 50. The top surface of the first interlayer insulation film 50 is exposed within the fuse region 13. A plurality of the fuses 40 are formed in parallel in the bottom portion of the exposed first interlayer insulation film 50.

First Embodiment

The fabricating method of the semiconductor device of the first embodiment will be described with reference to FIGS. 2A to 2K. FIGS. 2A to 2K are process diagrams for explaining the fabricating method of the semiconductor device of the first embodiment, illustrating indicating a sectional face of a major portion of the structure obtained in each stage of the fabricating.

According to this embodiment, the fuse region and the wiring region are defined in the base and a fuse is formed on the fuse region of the base. This process will be described below.

First, a p-type silicon substrate 12 is prepared as the semiconductor substrate. An element isolating region is formed on this silicon substrate 12 according to an appropriate preferable method. For example, in formation of the element isolating region, a trench (groove) is formed by etching the silicon substrate 12 and the trench is filled with silicon oxide film (hereinafter referred to as element isolating oxide film) 14. The n-well 16 is formed by implanting ions such as P, As which are n-type impurities. In a following description, the silicon substrate 12 in which the element isolation and the well formation are achieved is called base 10.

Figure 2A:
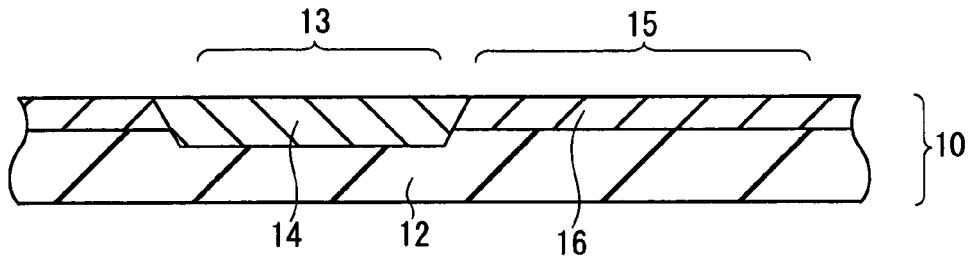
FIG. 2A is a process diagram for explaining fabricating process of the semiconductor device of a first embodiment.

Next, the fuse region 13 and the wiring region 15, which are areas with no fuse formed are defined in the base 10 as sectioned areas. The fuse region 13 is set above, for example, the element isolating oxide film 14 (FIG. 2A).

Next, the gate electrode 22 is formed. The formation of this gate electrode 22 may be carried out as follows.

First, after the oxide film is formed on the base 10 by thermal oxidation, a conductive film and a silicon nitride film are formed on this oxide film in this order. This conductive film is formed as polycide structure in which a polysilicon film and a tungsten silicide film are laminated in order. The polysilicon film is formed by chemical vapor deposition (CVD) method. On the other hand, the tungsten silicide film, which is high-melting point metallic silicide film, is formed by sputtering method. Further, the silicon nitride film is formed by reduced pressure CVD method.

Figure 2B:
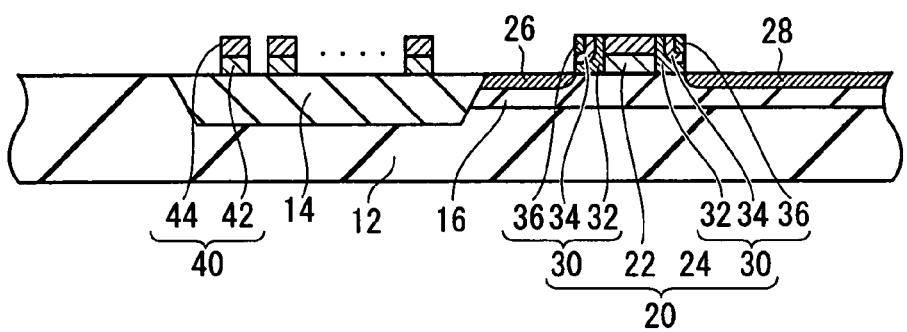
FIG. 2B is a process diagram for explaining fabricating process of the semiconductor device of the first embodiment.

After that, the gate electrode 22 is formed on the n-well 16 by patterning the conductive film by photolithography and dry etching. At this time, accompanied by formation of the gate electrode 22, a gate electrode wiring 42 to be electrically connected to the gate electrode 22 is formed on the element isolating oxide film 14 of the fuse region 13. Silicon nitride films 24, 44 are left both on the top surface of the gate electrode 22 and the top surface of the gate electrode wiring 42 after the gate electrode 22 and the gate electrode wiring 42 are patterned. In a subsequent description, a lamination of the gate electrode wiring 42 and the silicon nitride film 44 formed on the gate electrode wiring 42 is called fuse 40 (FIG. 2B).

Next, the charge accumulating portion 30 in which bottom silicon oxide film 32, silicon nitride film 34 and top silicon oxide film 36 are laminated in order on both side walls of the gate electrode 22 is formed using any well-known methods. Further, after impurity is injected into areas which function as the source 26 or the drain 28 of the MOSFET, this impurity is diffused to form impurity diffusion region.

Next, according to this embodiment, first insulation film 51 is formed on the base 10 and the fuse 40.

To form the first insulation film 51, after a silicon nitride film 51a is deposited on the base 10 on which the fuse 40 and the ROM 20 are formed, a boro-phospho silicate glass (BPSG) film 51b is deposited by the CVD method using tetraethylorthosilicate (TEOS)-O3 as a material gas.

After the BPSG film 51b is reflowed in nitrogen atmosphere at about 800° C., the top surface of the BPSG film 51b is planarized by chemical mechanical polishing (CMP) method.

Figure 2C:
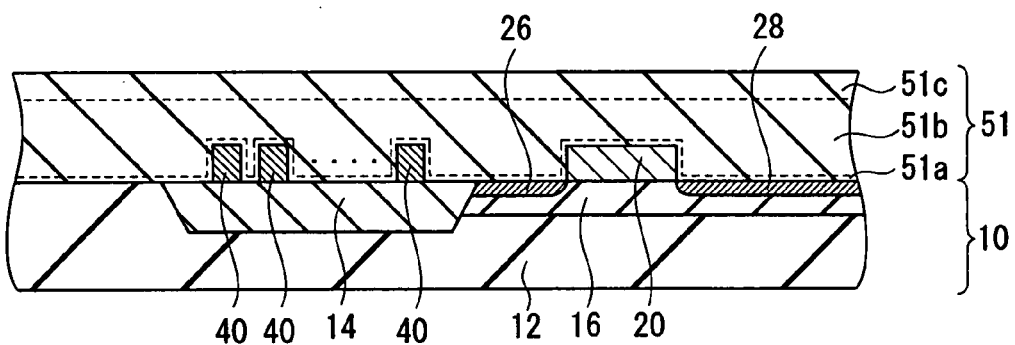
FIG. 2C is a process diagram for explaining fabricating process of the semiconductor device of the first embodiment.
Figure 2D:
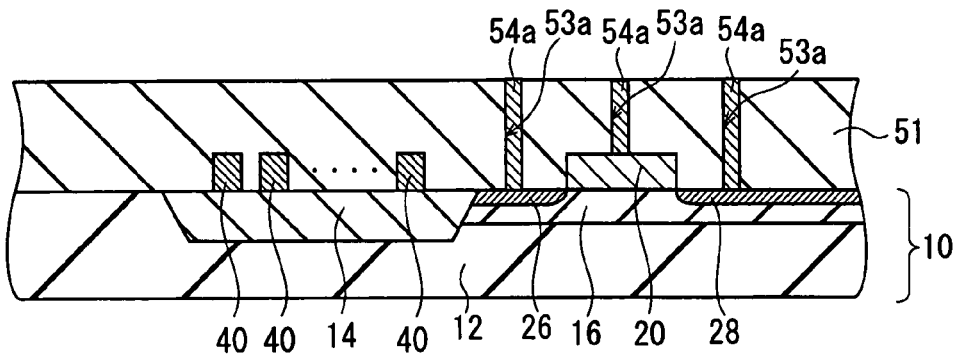
FIG. 2D is a process diagram for explaining fabricating process of the semiconductor device of the first embodiment.

A silicon oxide film (TEOS oxide film) 51c is formed on the flat top surface of the BPSG film 51b by the reduced pressure CVD method using TEOS as a material gas. A lamination of the silicon nitride film 51a, the BPSG film 51b and the TEOS oxide film 51c is called first insulation film 51 (FIG. 2C).

Next, after a first contact opening 53a is formed in the first insulation film 51 of the wiring region 15, the first contact opening 53a is filled with tungsten as conductive material to form a first plug 54a.

In this process, the first contact opening 53a is formed by photolithography and dry etching to expose the base 10 or the gate electrode 22 in this first contact opening 53a.

Subsequently, titanium (Ti) and titanium nitride (TiN) are deposited within the first contact opening 53a and on the first insulation film 51 by the CVD method. At this time, thin film of Ti and TiN is formed on the bottom surface of the first contact opening 53a. After tungsten (W) is deposited by the CVD method, Ti, TiN and W on the first insulation film 51 are removed by the CMP method or dry etching. As a result, the first plug 54a in which W is filled in the first contact opening.

Figure 2E:
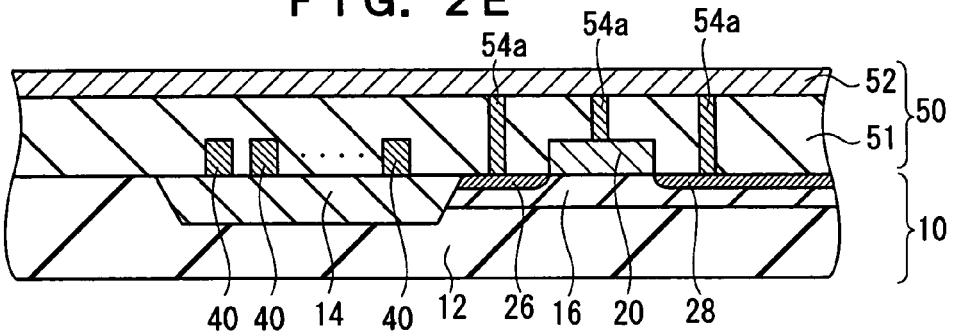
FIG. 2E is a process diagram for explaining fabricating process of the semiconductor device of the first embodiment.

Next, according to this embodiment, a second insulation film 52 is formed on the first plug 54a and the first insulation film 51. More specifically, the second insulation film 52 is formed by depositing a silicon oxide film on the first insulation film 51 in which the first plug 54a is formed by the reduced pressure CVD method using TEOS as a material gas (FIG. 2E).

Next, a second contact opening 53b is formed at a portion of the second insulation film 52 on the first plug 54a by patterning the second insulation film 52 by photolithography and dry etching, and a stopper opening 57 which exposes the first insulation film 51 of the fuse region 13 is formed.

Next, according to this embodiment, a second plug 54b is formed by filling the second contact opening 53b with tungsten as a conductive material, and a stopper film 55 is formed in the stopper opening 57. More specifically, like formation of the first plug 54a, a thin film of Ti and TiN are formed in the second contact opening 53b, in the stopper opening 57 and on the second insulation film 52 by the CVD method, and after that, W is deposited and further, Ti, TiN and W on the second insulation film 52 are removed by the CMP method. As a result, the second plug 54b in which the second contact opening 53b is filled with tungsten is formed. The conductive plug 54 is constituted by the first plug 54a and the second plug 54b. The stopper film 55 is formed by filling the stopper opening 57 with tungsten. The stopper film 55 is insulated electrically from the conductive plug 54.

Figure 2F:
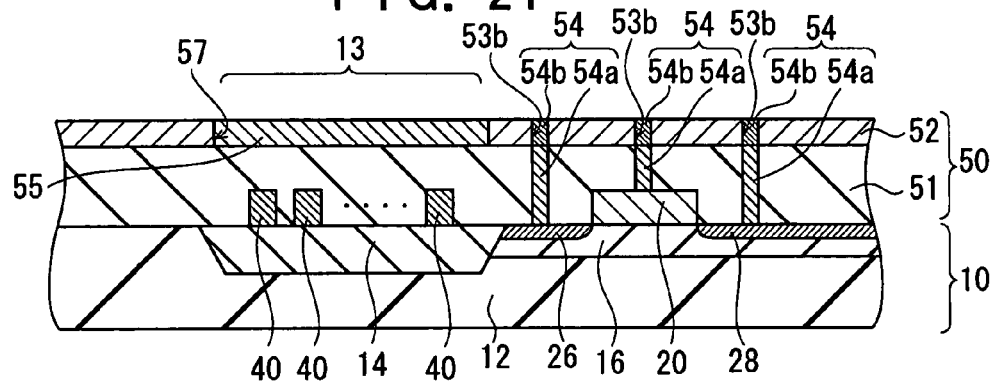
FIG. 2F is a process diagram for explaining fabricating process of the semiconductor device of the first embodiment.

The stopper film 55 functions as an etch stop when the fuse window is formed in the fuse region 13 by etching the interlayer insulation film formed on the stopper film 55 during a subsequent process. Therefore, to equalize the thickness of the insulation film in the fuse region 13, it is preferable to form the stopper film 55 or the stopper opening 57 in a size larger than that of the fuse region 13 so that a part of the stopper film 55 remains in a frame-like form when the stopper film 55 is etched in a subsequent process (FIG. 2F).

Next, according to this embodiment, after the wiring pattern (LSI wiring) is formed on the second insulation film 52 in the wiring region 15, an interlayer insulation film is formed on the second insulation film.

Figure 2G:
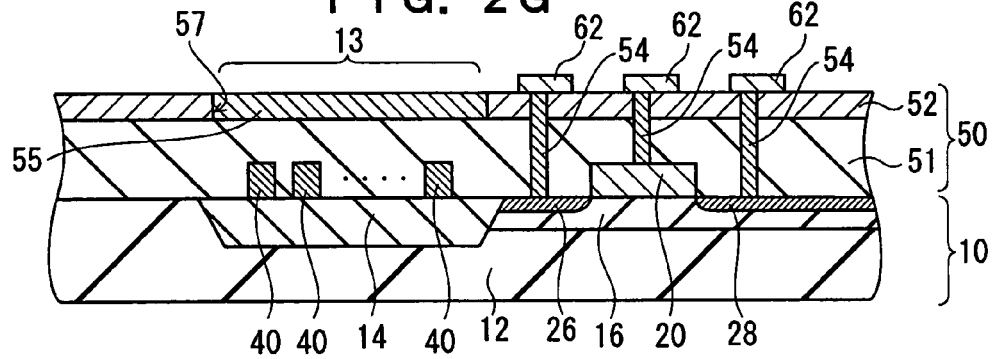
FIG. 2G is a process diagram for explaining fabricating process of the semiconductor device of the first embodiment.

In this process, first, a film formed of material containing mainly aluminum, for example, aluminum alloy film is deposited on the second insulation film 52 by sputtering method. After that, the first wiring pattern 62 is formed by patterning the aluminum alloy film by photolithography and dry etching. At this time, the conductive plug 54 is electrically connected with the first wiring pattern 62. The aluminum alloy film on the stopper film 55 is removed completely by patterning so that the stopper film 55 is exposed. Although the stopper film 55 is etched after the aluminum alloy film is etched, the stopper film 55 is etched only an amount of overetching after patterning of the aluminum alloy film and most part of the stopper film 55 is left without being removed. In the meantime, in a following description, a lamination of the first insulation film 51 and the second insulation film 52 sometimes may be called first interlayer insulation film 50 (FIG. 2G).

Figure 2H:
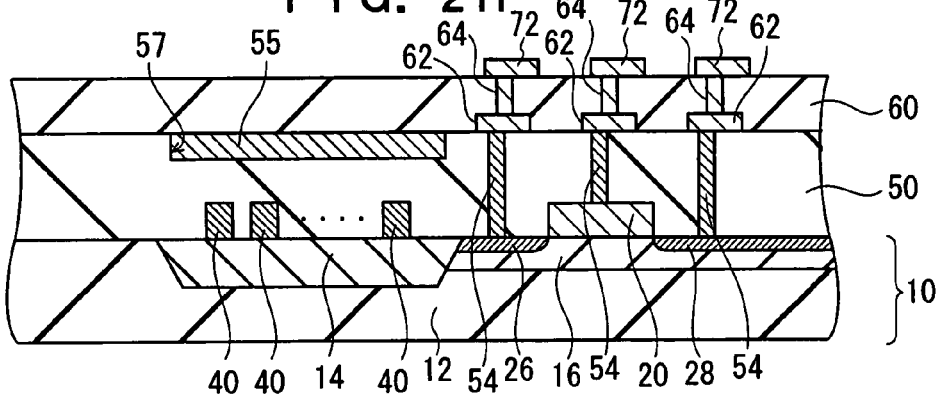
FIG. 2H is a process diagram for explaining fabricating process of the semiconductor device of the first embodiment.

Next, by the CVD method, the second interlayer insulation film 60 is formed by depositing silicon oxide film on the first interlayer insulation film 50. After that, an opening, in which the first wiring pattern is exposed, is formed in the second interlayer insulation film 60 of the wiring region 15. Further, by the CVD method and CMP method, the conductive plug 64 is formed by filling the opening with W. After that, second wiring pattern 72 is formed on the second interlayer insulation film 60 like the first wiring pattern 62 (FIG. 2H).

Figure 2I:
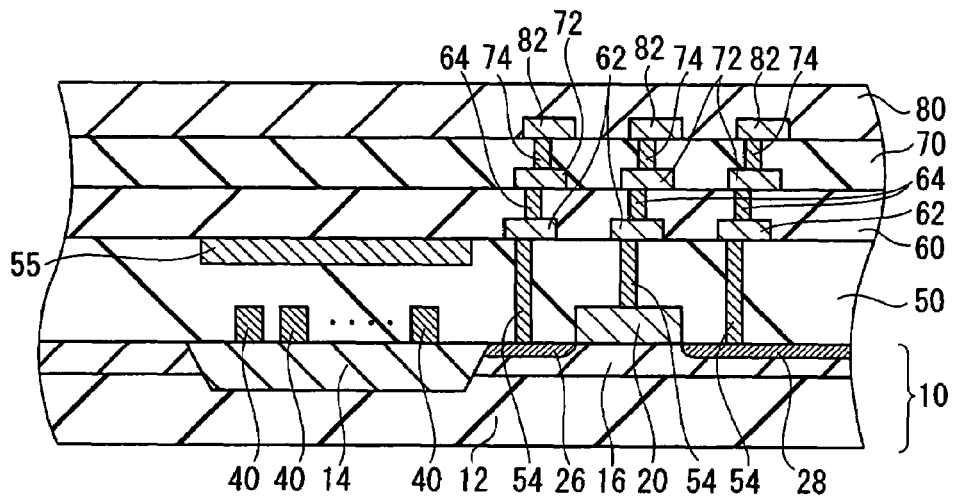
FIG. 2I is a process diagram for explaining fabricating process of the semiconductor device of the first embodiment.

After that, a third interlayer insulation film 70, a conductive plug 74 and a third wiring pattern 82 are formed in this order so as to obtain a multilayer wiring structure. Although an example of a three-layer structure as a multilayer wiring structure has been described, the number of the layers is not restricted to three. After the multilayer wiring structure is obtained, a silicon oxide film and a silicon nitride film are deposited in this order by the plasma CVD method to form a protective film 80 for covering the wiring pattern (FIG. 2I).

Figure 2J:
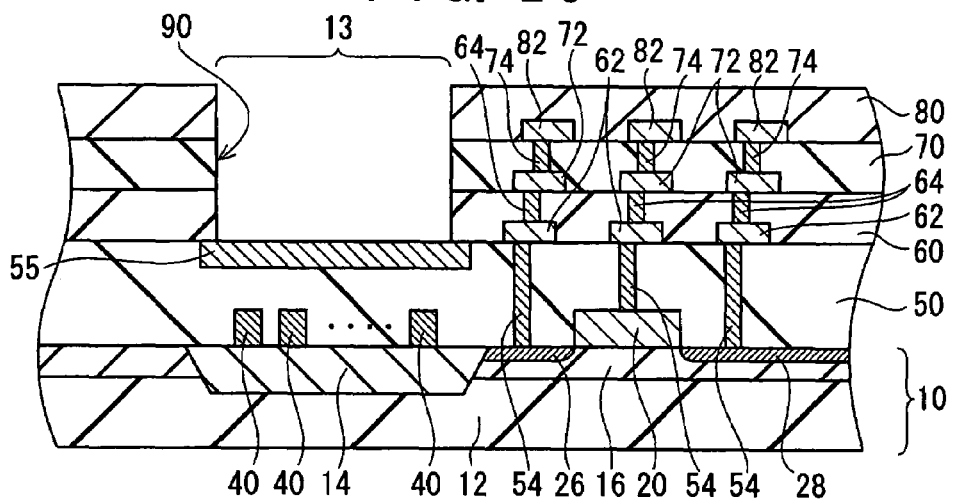
FIG. 2J is a process diagram for explaining fabricating process of the semiconductor device of the first embodiment.

Next, in this embodiment, interlayer insulation film other than the first interlayer insulation film 50 of the fuse region 13 is removed by etching to expose the stopper film. More specifically, the protective film 80, and the second and the third interlayer insulation films 60 and 70 in the fuse region 13 are removed by any preferred well-known photolithography followed by dry etching to form the fuse window 90. The stopper film 55 is exposed on the bottom of the fuse window 90 (FIG. 2J).

Figure 2K:
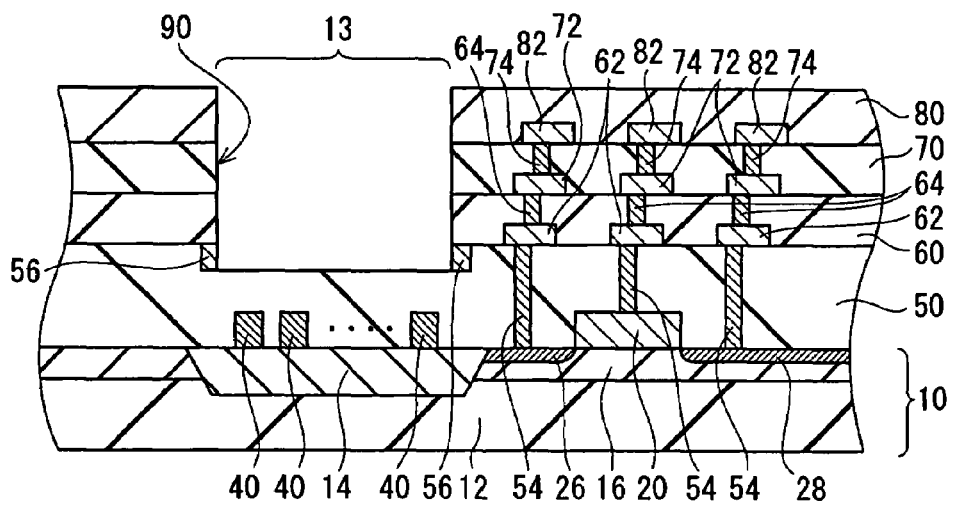
FIG. 2K is a process diagram for explaining fabricating process of the semiconductor device of the first embodiment.

Next, the stopper film 55 made of tungsten is removed by dry etching. At this time, a portion of the stopper film 55 is left around the fuse window 90 as a tungsten frame 56 (FIG. 2K).

Because tungsten is used as the stopper film according to the fabricating method of the first embodiment, aluminum is not left on the side wall of the fuse window even if aluminum alloy is used for the first wiring pattern. Tungsten may relax limitation of humidity resistance in a subsequent process because it is less likely to deteriorate due to corrosion than aluminum.

Further, the stopper film is formed at the same time as the conductive plug is formed. Accordingly, the stopper film is formed so as to be filled within the first interlayer insulation film 50 but not formed on the first interlayer insulation film 50. Thus, the thickness of the insulation film on the fuse 40 may be reduced compared to a conventional art while maintaining uniformity of the thickness.

A silicon nitride film is hard to be cut by a laser beam compared with a silicon oxide film. Thus, if the silicon nitride film exists on the gate wiring pattern, irradiation time of the laser beam will be prolonged. Further, if the output of the laser is increased to shorten the irradiation time, a crack will be formed in the insulation film, thereby possibly deteriorating the performance of the semiconductor device.

Because the insulation film on the fuse can be thinner than conventional ones according to the fabricating method of the semiconductor device of the first embodiment, the fuse can be cut out by a laser beam of a conventional output even if a nitride film is formed on the conductive film constituting the fuse.

Although an example of the ROM has been described as the semiconductor device, the fabricating method of the semiconductor device of the first embodiment is not restricted to this example. This method may be used for fabricating the semiconductor device having a silicon nitride film on the wiring as a fuse, such as a reflection preventing film for suppressing light reflection in photolithography. Further, although an example of using tungsten as the conductive material has been indicated above, the conductive material is not restricted to tungsten, however, copper or the like may be used.

Second Embodiment

A fabricating method of the semiconductor device of the second embodiment will be described with reference to FIGS. 3A to 3E. FIGS. 3A to 3E are process diagrams for explaining the fabricating method of the semiconductor device of the second embodiment, illustrating a sectional face of a main portion of a structure obtained in each fabricating process.

According to this embodiment, the fuse region 13 and the wiring region 15 are defined on the base 10 and the fuse 40 is formed on the fuse region 13 of the base 10. After that, an insulation film is formed on the base 10 and the fuse 40. Here, the insulation film is assumed to be a lamination in which a second insulation film 52 is formed on a first insulation film 51. Hereinafter, this insulation film sometime may be called the first interlayer insulation film 50.

Because processes up to formation of the second insulation film 52 on the first insulation film 51 are the same as the first embodiment described with reference to FIGS. 2A to 2E, description thereof is omitted.

Figure 3A:
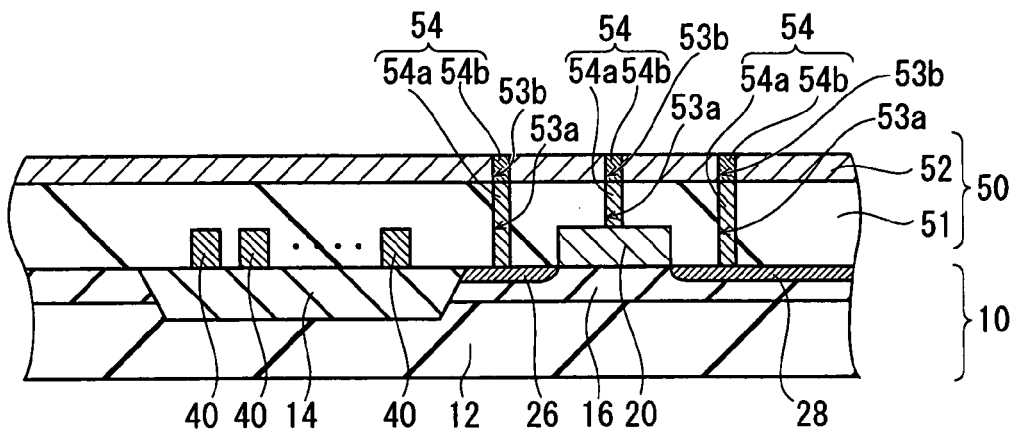
FIG. 3A is a process diagram for explaining fabricating process of the semiconductor device of a second embodiment.

After the second insulation film 52 is formed, the second insulation film 52 is patterned by photolithography followed by dry etching to provide a second contact opening 53b at a portion of the second insulation film 52 on the first plug 54a. This embodiment is different from the first embodiment in that the stopper opening is not formed. Next, after thin films of Ti and TiN are formed within the second contact opening 53b and on the second insulation film 52 by the CVD method, W is deposited. Then, Ti, TiN and W on the second insulation film 52 are removed by the CMP method. As a result, the second plug 54b, which is formed of W filled in the second contact opening 53b, is formed. The conductive plug 54 is constituted by both the first plug 54a and the second plug 54b (FIG. 3A).

Next, in this embodiment, after the wiring pattern and the conductive film pattern electrically insulated from the wiring pattern and having a stopper film for covering the fuse region are formed, an interlayer insulation film is formed on the insulation film.

Figure 3B:
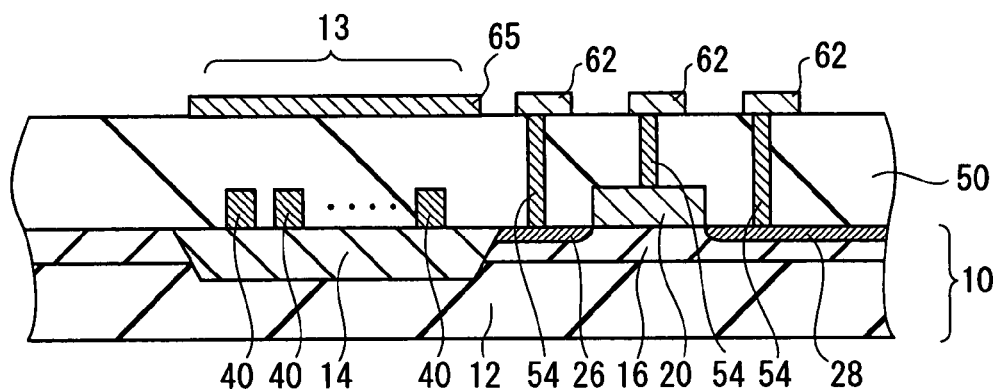
FIG. 3B is a process diagram for explaining fabricating process of the semiconductor device of the second embodiment.

In this process, aluminum alloy film is deposited on the second insulation film 52 by, for example, sputtering method. After that, a conductive film pattern is formed by patterning the aluminum alloy film by photolithography followed by dry etching. This conductive film pattern includes the first wiring pattern 62 and the stopper film 65. The conductive plug 54 is electrically connected to the first wiring pattern 62. The stopper film 65 is formed on the second insulation film 52 of the fuse region 13. The stopper film 65 is electrically insulated from the first wiring pattern 62 and the conductive plug 54 (FIG. 3B).

Here, the stopper film 65 functions as an etch stop when the fuse window is formed in the fuse region 13 by etching the interlayer insulation film formed on the stopper film 65. Thus, to equalize the thickness of the insulation film in the fuse region 13, it is preferable to form the stopper film 65 in a size larger than that of the fuse region 13 so that a portion of the stopper film 65 is left in a frame-like form after the stopper film 65 is etched in a subsequent process.

Figure 3C:
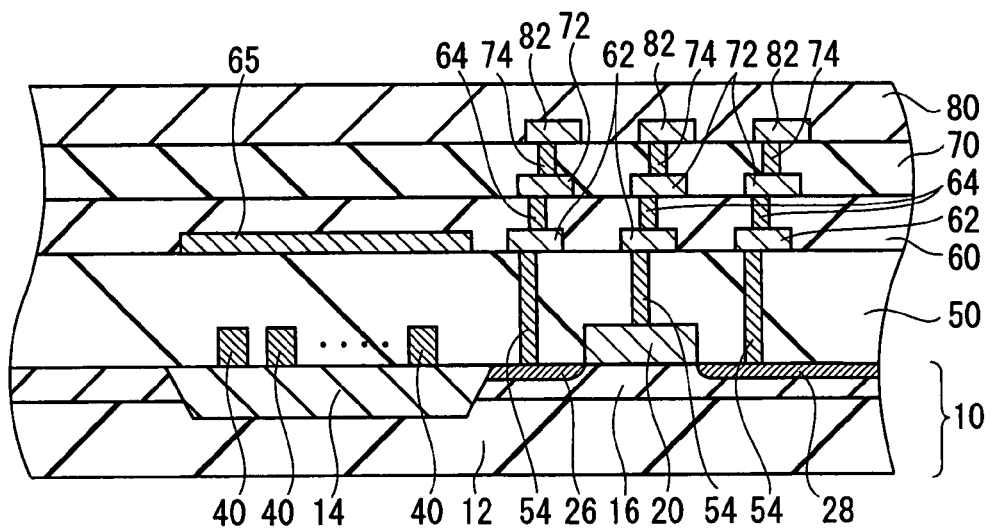
FIG. 3C is a process diagram for explaining fabricating process of the semiconductor device of the second embodiment.

Because the processes for forming the second interlayer insulation film 60, the conductive plug 64, the second wiring pattern 72, the third interlayer insulation film 70, the conductive plug 74, the third wiring pattern 82 and the protective film 80 is the same as those of the first embodiment described with reference to FIGS. 2H and 2I, description thereof is omitted (FIG. 3C).

Next, according to this embodiment, the stopper film 65 is exposed by etching the interlayer insulation film in the fuse region 13. More specifically, the protective film 80 in the fuse region 13, the second and third interlayer insulation films 60, 70 are removed by photolithography followed by etching to form the fuse window 90. The stopper film 65 is exposed on the bottom of the fuse window 90.

Figure 3D:
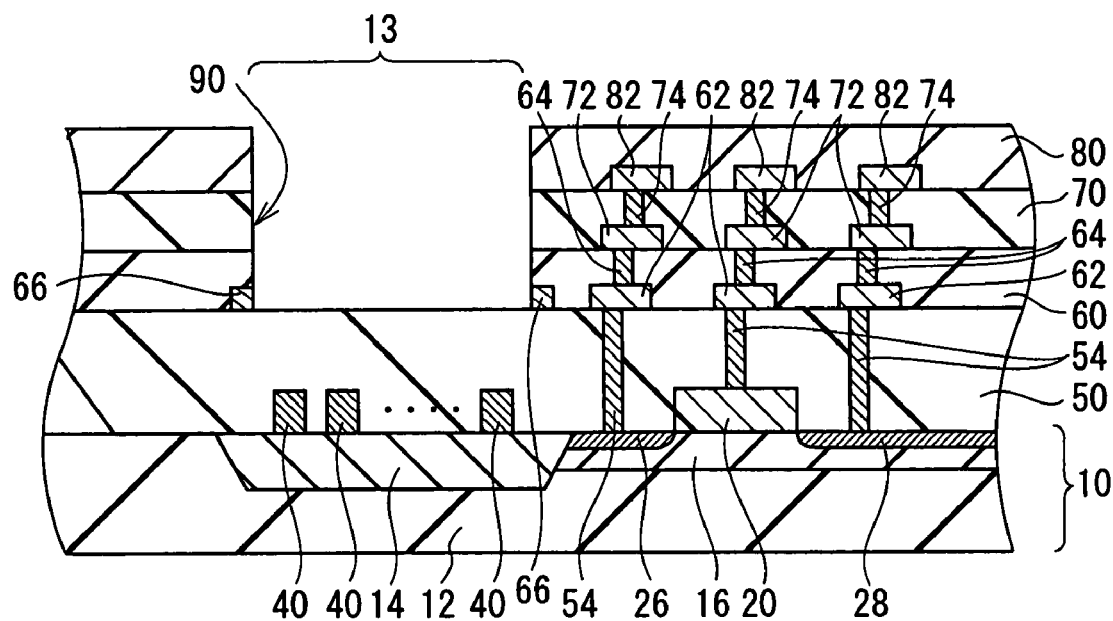
FIG. 3D is a process diagram for explaining fabricating process of the semiconductor device of the second embodiment.

Next, according to this embodiment, the stopper film 65 in the fuse region 13 is removed by etching. At this time, a portion of the stopper film 65 is left as a frame-like aluminum frame 66. This aluminum frame 66 is exposed in the fuse window 90 (FIG. 3D).

Figure 3E:
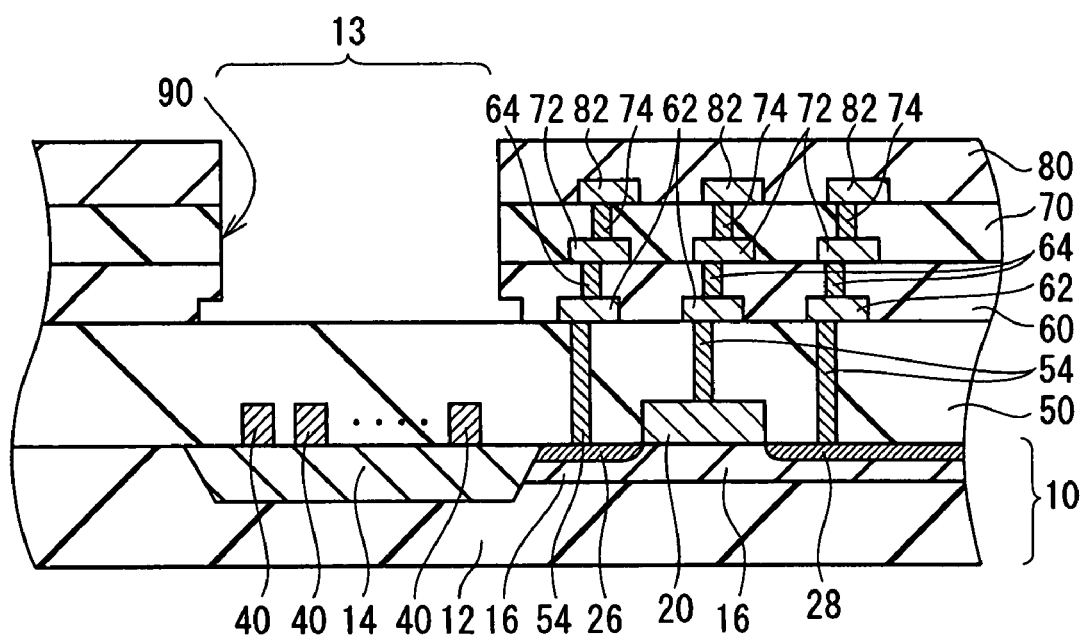
FIG. 3E is a process diagram for explaining fabricating process of the semiconductor device of the second embodiment.

Next, in this embodiment, a portion of the stopper film 65 left exposed on the side wall of the fuse window 90 is removed by wet etching using diluted nitric acid as an etchant. The concentration of this diluted nitric acid may be in a range of 5 to 50 weight %. Because the etching rate is maximized when the concentration of diluted nitric acid is 20 weight %, the concentration is preferred to be adjusted to 10 to 30 weight % (FIG. 3E).

Although aluminum alloy is used as the stopper film according to the fabricating method of the second embodiment, aluminum, which is left in the fuse region after the stopper film is etched, is removed by wet etching. As a consequence, aluminum, which corrodes easily, is not exposed out of the fuse window. Therefore, limitation of humidity resistance in a subsequent process may be relaxed.

Further because the stopper film is provided on the first interlayer insulation film by forming the stopper film at the same time as when the first wiring pattern is formed, the thickness of the insulation film on the fuse can be made larger than the first embodiment. Consequently, even if a silicon nitride film does not exist on the gate electrode wiring or even if an output of the laser is too strong, there is no fear that the insulation film under the fuse may be cut by mistake when the fuse is cut by the laser beam.

What is claimed is:

1. A fabricating method of a semiconductor device comprising:
    defining a fuse region and a wiring region on a base to form a fuse in the fuse region of the base;
    forming a first insulation film on the base and the fuse;
    forming a first contact opening through the first insulation film in the wiring region;
    forming a second insulation film on a first plug and the first insulation film;
    forming a second contact opening and a stopper opening through the second insulation film so as to respectively expose a surface of the first plug, and a surface of the first insulation film over the fuse region;
    filling, with a conductive material, the second contact opening to form a second plug, and the stopper opening to form a stopper film, the second plug being stacked directly on the first plug to form a single plug;
    forming a wiring pattern on the second insulation film in the wiring region;
    forming an interlayer insulation film on the stopper film, the wiring pattern and the second insulation film;
    exposing the stopper film by removing the interlayer insulation film in the fuse region by etching; and
    removing the stopper film by etching.

2. The fabricating method of the semiconductor device of claim 1, further comprising forming a lamination in which a conductive film and a silicon nitride film are laminated on the base as the fuse.

3. The fabricating method of the semiconductor device of claim 1, wherein the stopper opening is formed in a size larger than that of the fuse region.

4. The fabricating method of the semiconductor device of claim 2, wherein the stopper opening is formed in a size larger than that of the fuse region.

5. The fabricating method of the semiconductor device of claim 1, wherein tungsten is used as the conductive material.

6. The fabricating method of the semiconductor device of claim 2, wherein tungsten is used as the conductive material.

7. The fabricating method of the semiconductor device of claim 1, wherein the wiring pattern is formed of a material mainly composed of aluminum.

8. The fabricating method of the semiconductor device of claim 2, wherein the wiring pattern is formed of a material mainly composed of aluminum.

9. The fabricating method of the semiconductor device of claim 1, wherein the second plug is stacked directly on the first plug to form a single plug through the first insulation film and the second insulation film.

10. The fabricating method of the semiconductor device of claim 1, wherein the forming the second contact opening and the stopper opening occurs concurrently.

11. The fabricating method of the semiconductor device of claim 1, wherein the filling the second contact opening and the stopper opening occurs concurrently.

12. A method of fabricating a semiconductor device, the method comprising:
    forming a fuse on the surface of a base in a fuse region of the semiconductor device;
    forming a first insulation film over the base and the fuse;
    forming a first contact opening through the first insulation film in a wiring region of the semiconductor device;
    filling the contact opening with a conductive material to form a first plug in the contact opening;
    forming a second insulation film over the first plug and the first insulation film;
    forming, through the second insulation film, a second contact opening over the first contact opening, and a stopper opening in the fuse region;
    filling, with a conductive material, the second contact opening to form a second plug stacked directly on the first plug, and the stopper opening to form a stopper film;
    forming, in the wiring region, a wiring pattern on the second insulation film;
    forming an interlayer insulation film over the stopper film, the wiring pattern, and the second insulation film;
    removing, by etching, the interlayer insulation film in the wiring region to expose the stopper film; and
    removing, by etching, the stopper film.

\* \* \* \* \*